United States Patent
Audet et al.

(10) Patent No.: US 7,454,833 B2
(45) Date of Patent: Nov. 25, 2008

(54) HIGH PERFORMANCE CHIP CARRIER SUBSTRATE

(75) Inventors: Jean Audet, Granby (CA); Irving Memis, Vestal, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 11/651,631

(22) Filed: Jan. 9, 2007

(65) Prior Publication Data

US 2007/0175658 A1 Aug. 2, 2007

Related U.S. Application Data

(63) Continuation of application No. 10/722,226, filed on Nov. 25, 2003, now Pat. No. 7,214,886.

(51) Int. Cl.
*H05K 3/00* (2006.01)
*H05K 3/10* (2006.01)

(52) U.S. Cl. .......................... 29/846; 29/849

(58) Field of Classification Search ........... 29/846–853; 174/260

See application file for complete search history.

(56) References Cited

U.S. PATENT DOCUMENTS

| | | | |
|---|---|---|---|
| 6,172,305 B1 | 1/2001 | Tanahashi | |
| 6,351,393 B1 | 2/2002 | Kresge et al. | 361/795 |
| 6,373,717 B1 | 4/2002 | Downes, Jr. et al. | 361/795 |
| 6,487,088 B2 | 11/2002 | Asai et al. | 361/794 |
| 6,518,516 B2 | 2/2003 | Blackwell et al. | 174/262 |
| 6,538,213 B1 | 3/2003 | Carden et al. | 174/262 |
| 6,744,067 B1 * | 6/2004 | Farnworth et al. | 257/48 |
| 2002/0060318 A1 | 5/2002 | Katz | 257/24 |
| 2003/0047352 A1 * | 3/2003 | Bhatia et al. | 174/260 |
| 2004/0188819 A1 * | 9/2004 | Farnworth et al. | 257/686 |

\* cited by examiner

*Primary Examiner*—Jeremy C Norris
(74) *Attorney, Agent, or Firm*—John A. Jordan; William H. Steinberg (57) ABSTRACT

A multilayer chip carrier with increased space for power distribution PTHs and reduced power-related noise. In a multilayer chip carrier with two signal redistribution fanout layers, in addition to signal escape from near-edge signal pads at the first fanout layer, remaining signal pads are moved closer to the edge of the chip footprint. At the voltage layer below the first fanout layer, the remaining signal pads are moved again, closer to the edge of the chip footprint. In the second fanout layer, below the voltage layer, the remaining signal pads escape. The region where signal pads are moved provides increased space for power PTHs.

7 Claims, 10 Drawing Sheets

FC2 Layer

FIG. 1
PRIOR ART

FC4 Ground
FC3 Signal Redistribution
FC2 Voltage V2
FC1 Signal Redistribution
IP1 Ground
IP2 Voltage V1
IP3 Ground
IP4 Voltage V2
BC1 Signal Redist. + Ground
BC2 Voltage V2
BC3 Signal Redist. + Voltage V1
BC4 BGA Pad Layer + Ground

FIG. 2
PRIOR ART

FIG. 3
Prior Art
FC4 Layer

FIG. 4
Prior Art
FC3 Layer

FIG. 5
Prior Art
FC2 Layer

FIG. 6
Prior Art
FC1 Layer

FIG. 7

FC3 Layer

FIG. 8
FC2 Layer

FIG. 9
FC1 Layer

HIGH PERFORMANCE CHIP CARRIER SUBSTRATE

This application is a continuation application based on parent application Ser. No. 10/722,226, filed Nov. 25, 2003 now U.S. Pat. No. 7,214,886 and allowed on Jan. 4, 2007.

BACKGROUND OF THE INVENTION

1. Field of the Invention

The present invention relates to chip carriers and, more particularly, to high density chip carriers with improved performance for use with flip chip technology, and the like.

2. Background and Related Art

As the terminal density of semiconductor chips and, particularly, the density of Input/Output (I/O) connections of chips increases with improved technology, the wireability of chip carriers becomes more problematic. The density of terminal pads tightly clustered makes it difficult to construct mutually segregated conductors to connect carrier lines to each terminal pads. Signal carrying terminal pads and lines are particularly burdensome since they must be segregated from each other as well as from power and ground lines. Signal lines on the chip carrier must have sufficient electrical isolation from other conductors so that undesired coupling and leakage paths are avoided.

To enable routing in highly dense chip carriers, microvia, as well as other technologies, have been developed. Microvia chip carriers typically use multiple layers to make the required interconnections, particularly in chip packages using flip-chip ball grid array (BGA) technology. In these high pin count technologies, the density of wiring and the wireability of the layers is important, particularly in terms of cost, yield, performance and reliability. "Wireability", in this regard, can be viewed as the technical possibility of positioning routing lines so that all signals may "escape" (inward or outward) from a given pattern or layer. Constraint considerations for routing include via density, routing line widths and clearances, the terminal pad sizes and required clearances, the shielding requirements and other design constraints known in the art.

Microvia chip carrier substrates are generally built around a core with plated thru holes (PTHs). Such high density interconnect (HDI) chip carriers use build-up of layers on each side of a core made of epoxy-glass layers. The glass layers are made of a glass cloth impregnated with epoxy and are laminated at elevated temperatures to make a solid, dimentionally stable core. The build up layers on each side of the core are generally non-reinforced epoxy. An example of a typical microvia chip carrier is that described in U.S. Pat. No. 6,518,516 B2

In chip carriers, such as microvia chip carriers, density constraints and limited space for PTHs under the chip limit the vertical interconnection capability between the front (chip side) and back (board side) of the carrier. This is a particular problem with regard to the power distribution requirements for higher I/O count, higher power chips. Fanout wiring requirements in the signal distribution layers necessarily limit the amount of space remaining in the middle of the chip for power distribution. As a result, the limited number of PTHs that can be accommodated in the remaining middle region under the chip causes poor power distribution characteristics and power related noise.

Although other solutions to these problems exist, such solutions have other drawbacks. For example, ceramic chip carriers and teflon-based chip carriers have been employed to provide improved power distribution but, these solutions are significantly more expensive. In addition, ceramic chip carriers have reliability problems at the interconnection of chip carrier and printed wiring board (PWB). Teflon-based carriers also have limited flexibility in terms of layer counts and wireability.

SUMMARY OF THE PRESENT INVENTION

Accordingly, it is an object of the present invention to provide an improved multilayer chip carrier and layout method therefor.

It is a further object of the present invention to provide an improved signal redistribution method and layout for a multilayer chip carrier.

It is yet a further object of the present invention to provide a multilayer chip carrier with increased space for power distribution.

It is yet still a further object of the present invention to provide a multilayer chip carrier with increased space for additional PTHs for power distribution.

It is yet another object of the present invention to provide a multilayer chip carrier with reduced power-related noise.

In accordance with the present invention, an improved fanout redistribution wiring arrangement for signal escape is provided which frees up space under the chip. The wiring arrangement is particularly effective where two signal redistribution layers are employed for signals to escape the chip. The wiring arrangement reroutes the second redistribution layer wiring so that it is substantially superimposed under the first redistribution layer of wiring. As a result, power PTHs are allowed to extend into the footprint of what would otherwise be signal escape area.

Accordingly, the redistribution wiring arrangement of the present invention frees space under the chip for additional power distribution PTHs that can be directly connected into substrate power planes such as to allow multiple pickup along power busses. The increased space allows for up to at least a twofold increase in the number of PTHs over the number allowed in conventional two level signal redistribution wiring and, thus, a substantial improvement in reducing power related noise.

DETAILED DESCRIPTION

Figure 1:
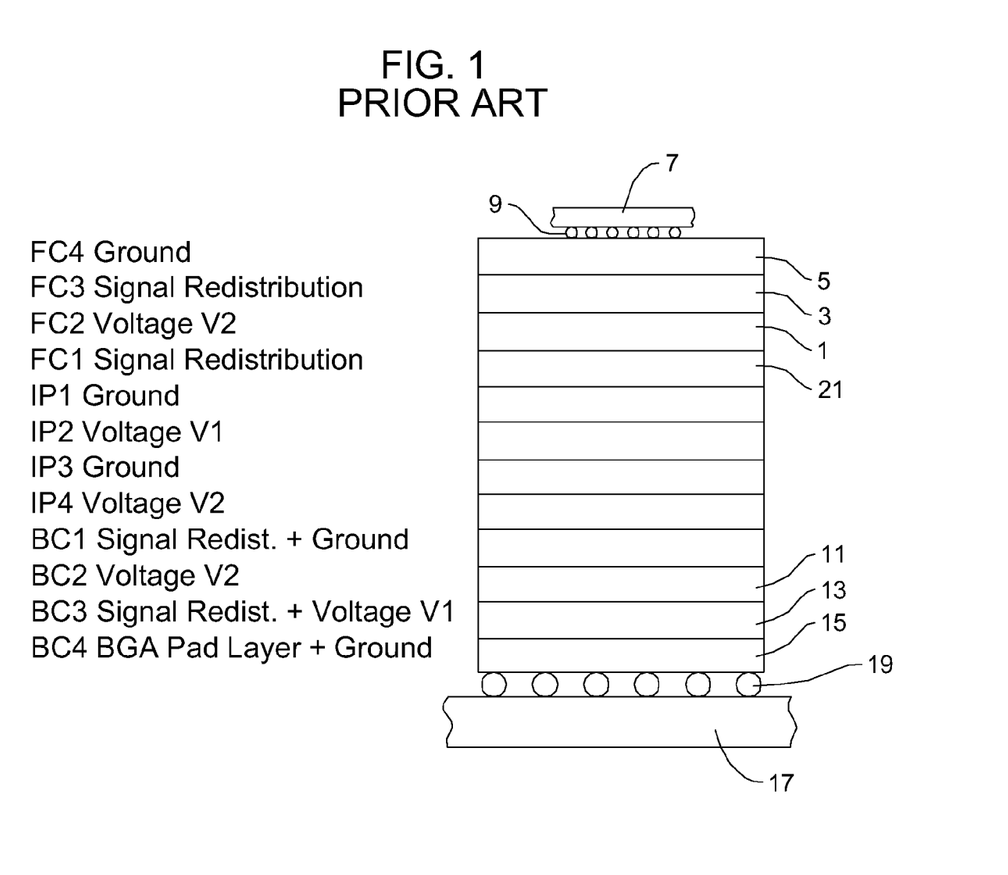
FIG. 1 shows a cross-sectional representation of a typical chip carrier with 3 buildup layers on each side.

With reference to FIG. 1, there is shown a typical chip carrier cross-section with three buildup layers on the chip side and three buildup layers on the printed circuit or printed wiring board side. Thus, layers 1, 3 and 5, corresponding to FC2, FC3 and FC4, respectively, act as buildup layers to which chip 7 is attached by way of solder contacts 9. Layers 11, 13, and 15, corresponding to BC2, BC3 and BC4, respectively, act as buildup layers which are attached to board 17 by way of solder contacts 19. Layer 3, shown as FC3, acts as the first fanout signal redistribution layer from the chip, and layer 21, shown as FC1, acts as the second fanout signal redistribution layer from the chip. Such an arrangement is typical of microvia chip carriers, for example.

Figure 2:
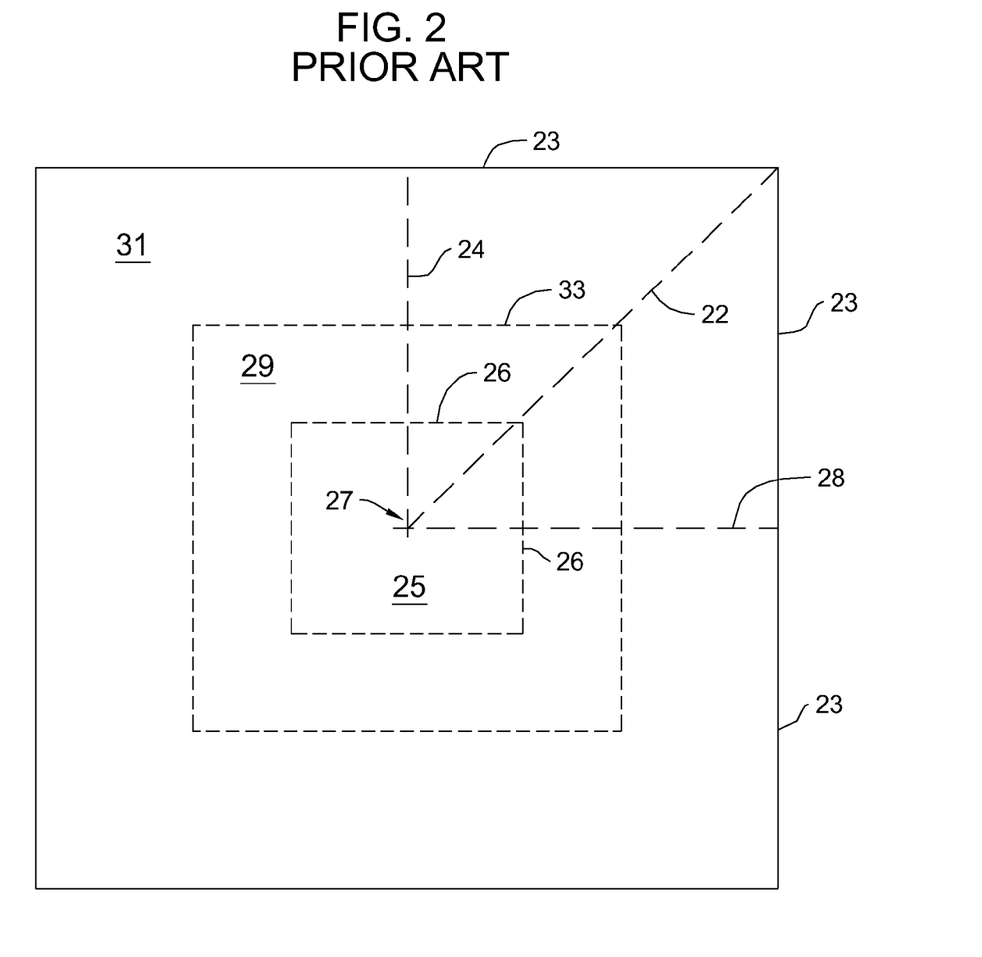
FIG. 2 represents a top view of the area of a chip with the dotted lines representing escape areas.

FIG. 2 represents the footprint of a typical chip. Such chips have a footprint that is generally rectangular, and may be square, with the chip edge defined by edge line 23. Inner region 25 represents the general area where the majority of power PTHs for distributing power are formed in prior art arrangements, which area is delineated by line 26. Point 27 represent a geometric reference point for the footprint which may approximates the central point of the chip footprint. Region 29, which surrounds region 25 and is delineated by line 33, represents the general area in the prior art where most, if not all, of the second set of signals escape from the chip. This occurs at the FC1 signal redistribution layer 21 in FIG. 1. Region 31, which surrounds region 29 and is delineated by line 23, represents the general area in the prior art where most, if not all, of the first set of signals escape from the chip. This occurs at the FC3 signal redistribution layer 3 in FIG. 1.

As is understood to those skilled in the art, "escape" means the level or chip carrier layer where signal pads carrying signals are connected to wires or busses extending outwardly to distribute the signals offchip. It should be understood that the arrangement of FIG. 2 is used to facilitate an understanding of the principles of the present invention. In practice, escape areas or regions may overlap and may be more irregular in shape than the areas or regions shown in FIG. 2. Similarly, all signal pads within a region may not necessarily escape at the same time.

Figure 3:
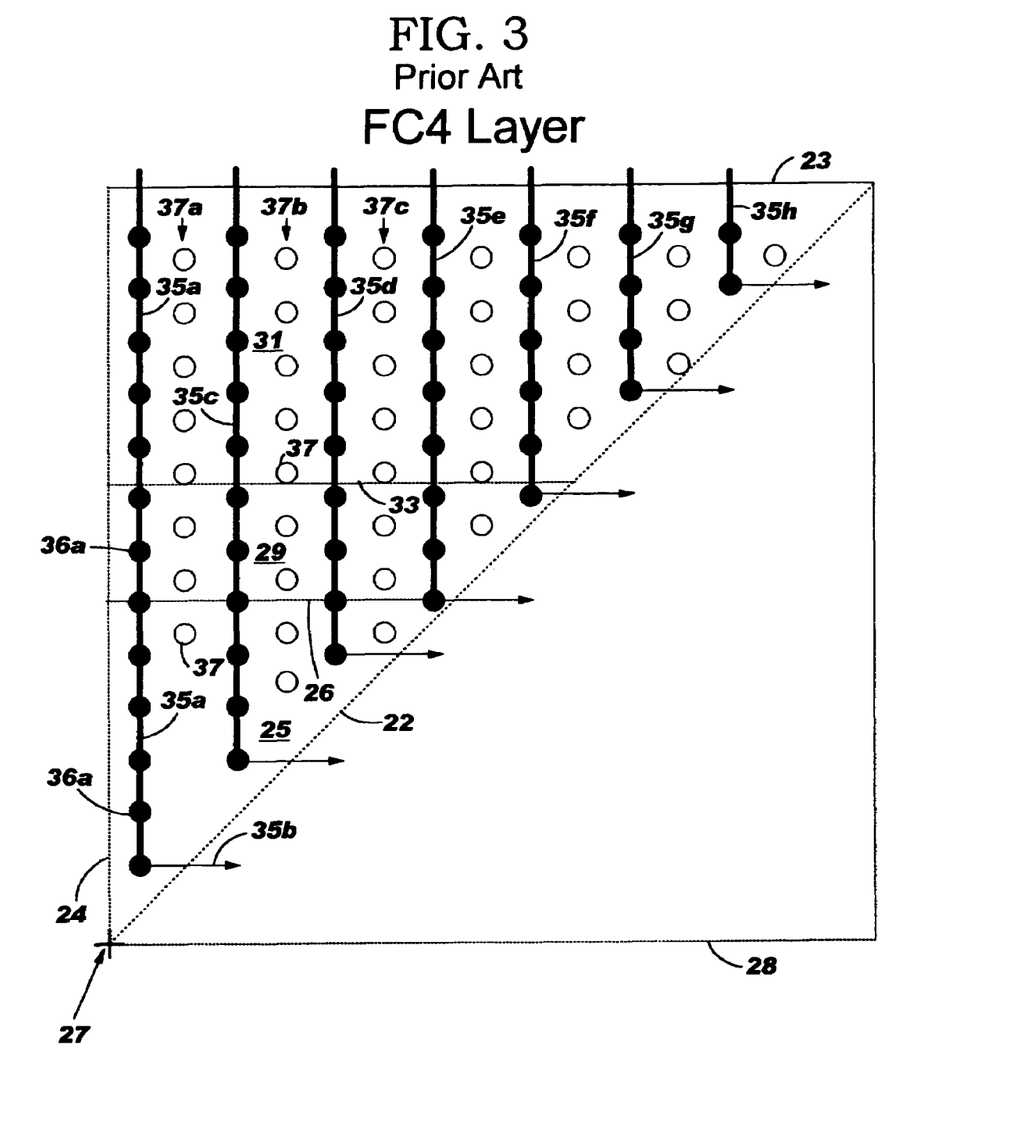
FIG. 3 shows a portion of the top view of a prior art FC4 ground layer, as represented in FIG. 1.

FIG. 3 shows a portion of a prior art top view of the FC4 ground/voltage layer 5 in FIG. 1, which layer attaches to chip 7. For simplicity, all of the features typically found on such layer are not necessarily shown. Rather shown are those features which are relevant to an understanding of the present invention. Similarly, for simplicity, only relevant features in the first quadrant are shown. It is clear that the same basic feature pattern may symmetrically exist over all four quadrants of the chip. The outer lines 23 in FIG. 3 represent the chip edge, as shown in FIG. 2, and dotted lines 22 and 26 delineate the inner triangular region shown in FIG. 2. Line 24 and 28 delineates the first quadrant shown in FIG. 2.

As is further shown in FIG. 3, region 25 within the dotted lines 22, 24 and 26 correspond to a portion of the prior art general area in FIG. 2 where power PTHs are formed. This triangular-shaped area in FIG. 3 corresponds to one eighth of area 25 in FIG. 2, with point 27 being the same reference point as shown in FIG. 2. Similarly, a portion of a region 29, as shown in FIG. 2, is formed in FIG. 3 between dotted lines 26 and 33 and, again, corresponds to the prior art area where the second set of signals escape from the chip. Region 31 in FIG. 3 corresponds to a portion of the prior art area of FIG. 2 where the first set of signals escape from the chip.

In the FC4 ground/voltage layer 5 shown in FIG. 3, vertical conductive lines 35 represent ground/voltage wires or busses 35*a*-*h*, with the periodic circular portions 36 representing ground/voltage pads. The arrows from these busses, such as 35*b*, indicate the extension of these busses in the horizontal direction. The columns of circles and on each side of the vertical ground/voltage busses represent conductive signal pads 37. Although only columns of conductive pads 37 are shown, it is clear that a similar pattern of rows of signal pads, extending to the right, would also be present. Similarly, the area in the lower half, i.e., below horizontal bus 35*b* (i.e. the second quadrant), could have a mirror image of corresponding columns and rows of signal pads and ground/voltage busses, and so also the same for the third and fourth quadrants. The configuration and number of pads and busses shown provides an example of how these elements or features might be arranged. Other configurations and numbers of pads and busses may as readily be employed.

In the arrangement of FIG. 3, a column 37*a* of eight signal pads is shown between busses 35*a* and 35*c*. Similarly, a column 37*b* of nine signal pads is shown between busses 35*c* and 35*d*. A third column 37*c* of signal pads is shown between busses 35*d* and 35*e*, and so on. As can be seen, region 25 is the region not fully occupied with signal pads and thus, is the main region to accommodate PTHs for power distribution.

Again, with reference to FIG. 3, in general, the majority of the first set of signals to typically escape the chip (at the FC3 level of FIG. 4) are taken from the upper signal pads above vertical line 33 within area 31. The majority of the second set of signals to escape the chip (at the FC1 level of FIG. 6) are taken from the signal pads in regions 25 and 29, below line 33. In the example shown, not all pads escape from region 31 with the first set of signals. This will be shown more clearly in FIG. 4.

Figure 4:
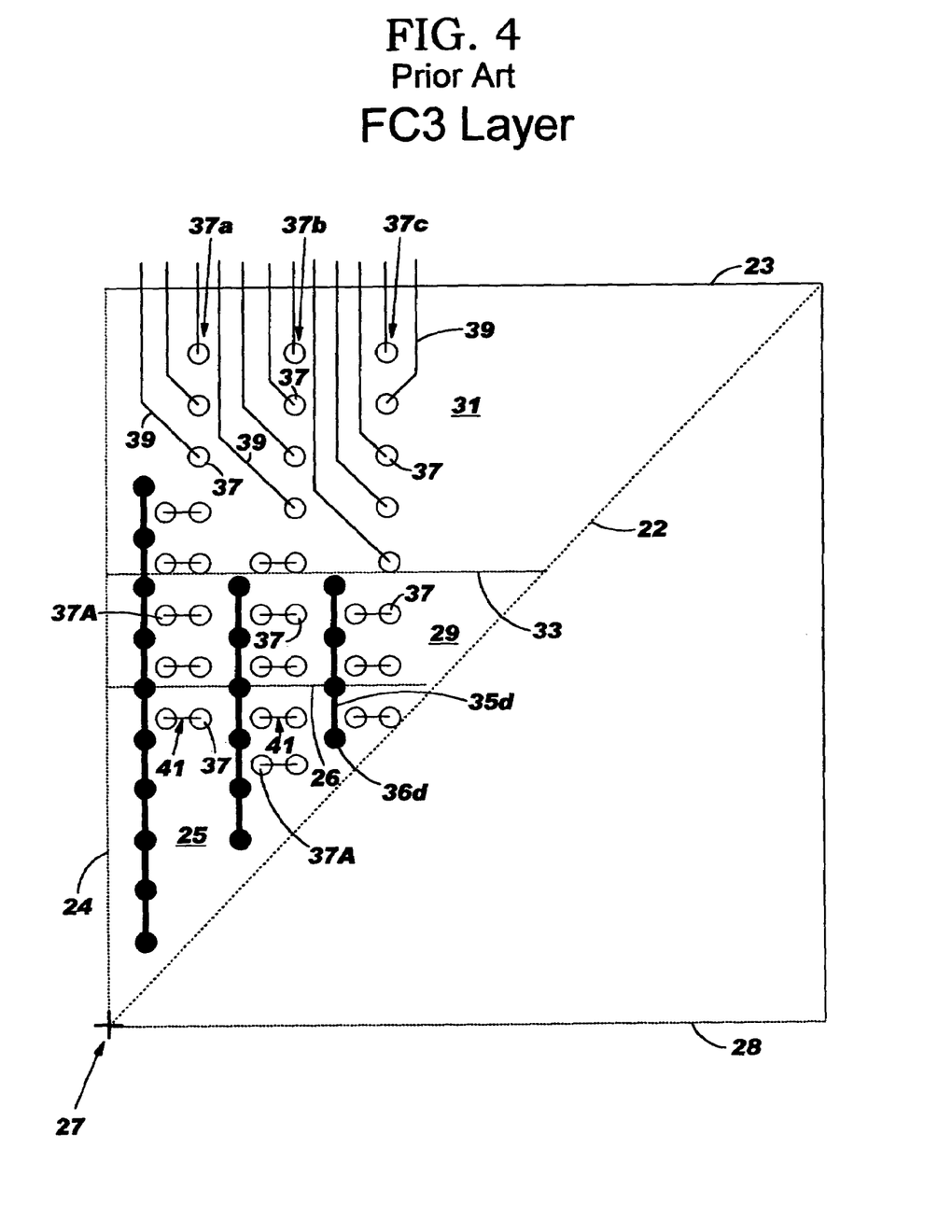
FIG. 4 shows a portion of the top view of a prior art FC3 signal redistribution layer, as represented in FIG. 1.

FIG. 4 shows a portion of a prior art top view of the FC3 signal redistribution layer 3 in FIG. 1. For simplicity, only a portion of the feature patterns of pads and ground/voltage busses shown in FIG. 3, are shown here. Accordingly, the escape pattern for only three columns of pads will be described but it is clear that a similar pattern exists for the remaining columns of signal pads. As is understood by those skilled in the art, conductive vias extend from signal pads 37 on the FC4 layer of FIG. 3 through the dielectric of that layer to signal pads 37 on the FC3 layer of FIG. 4. Similarly, in each of layers shown in the various layers described herein, conductive via arrangements are used to interconnect signal pads on one layer to signal pads on the next. An example of such a via arrangement is shown in FIG. 10, as will be described hereinafter.

At the FC3 level of FIG. 4, the first set of signals escape from the outer signal pads within region 31. Each of the escaping signal pads 37 show conductive wires or busses 39 attached thereto and extending upwardly and off the chip. Accordingly, each of the three signal pads that escape in column of pads 37*a* and the four signal pads that escape in column of pads 37*b*, for example, is attached to a conductive wires 39 to allow signals to escape outside the chip footprint. Similarly, each of the pads of the other columns of signal pads, such as the five signal pads from column 37*c*, are attached to wires 39 extending upwardly and outside the chip footprint. As can be seen, not all signal pads in region 31 escape with the first set but, in this example, 80% do. Thus, three signal pads shown in region 31 are left to escape with the second set of signal pads.

The signal pads shown within region 25 and 29 in FIG. 4 also do not escape at the FC3 level. Thus, for example, the remaining three signal pads in column of signal pads 37*c* do not escape. Similarly, the five signal pads in each of columns 37*a* and 37*b* do not escape. These remaining signal pads are moved, by way of what is known in the art as "dogbone" conductive connectors 41, to the left. Dogbone conductive connector 41 is used to move the signal pads laterally to another position for via connection to the next level. Such arrangement may be used, for example, for design purposes, such as, to avoid difficulties in fabricating conductive vias through successive layers of the chip carrier. In FIG. 4, dogbone conductive connectors 41 are used to shift each of the signal pads the same distance to the left.

Figure 5:
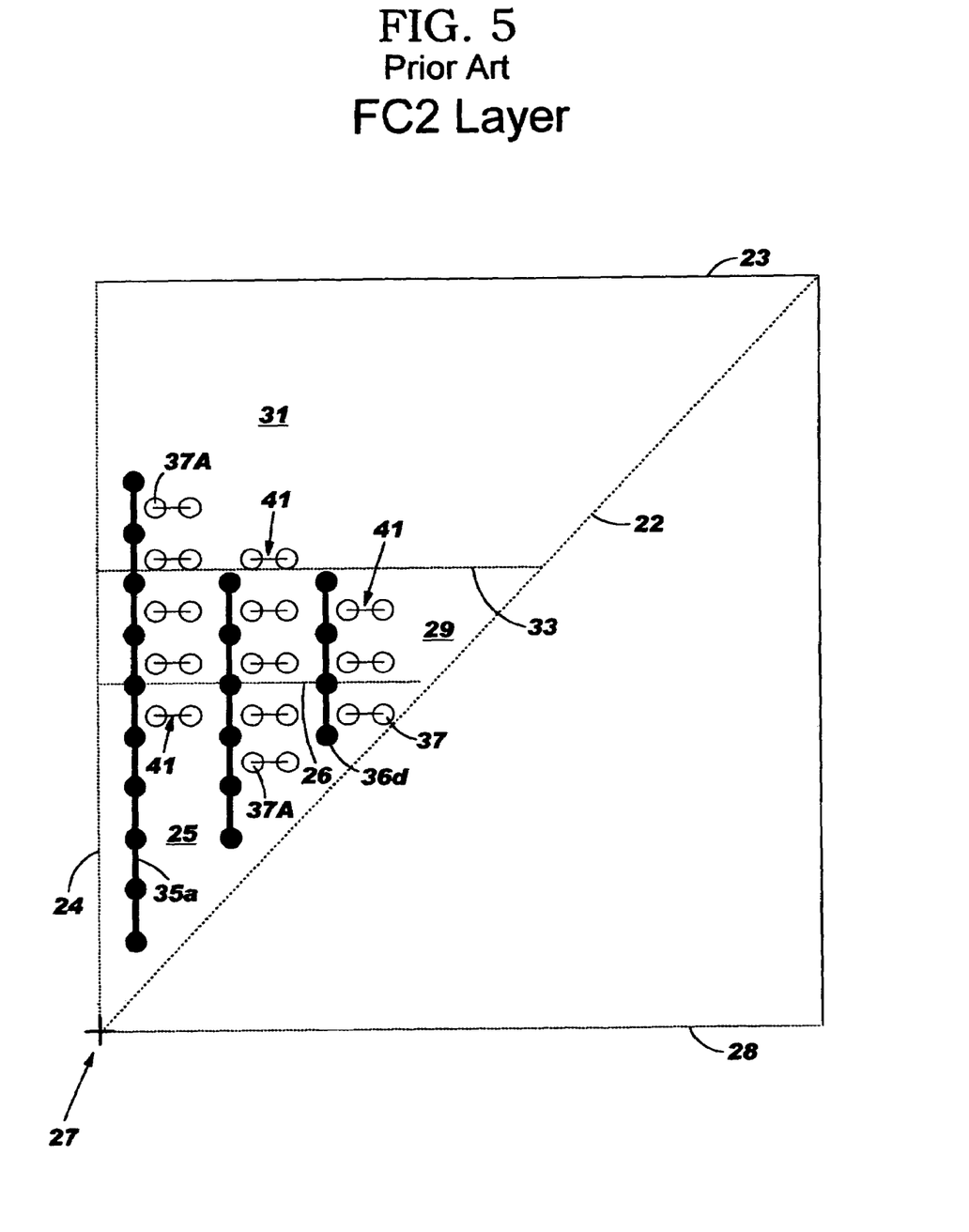
FIG. 5 shows a portion of the top view of a prior art FC2 voltage layer, as represented in FIG. 1.
Figure 10A:
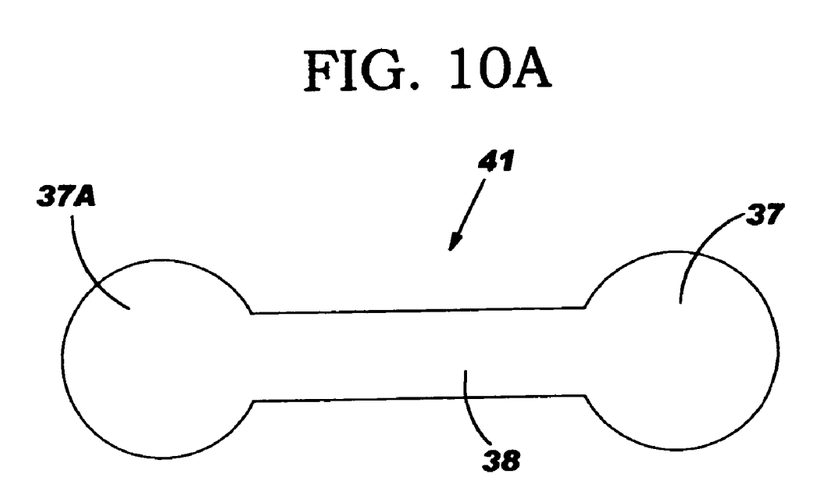
FIG. 10A shows a top view of a conductive connector and FIG. 10B shows a side view of the same connector.
Figure 10B:
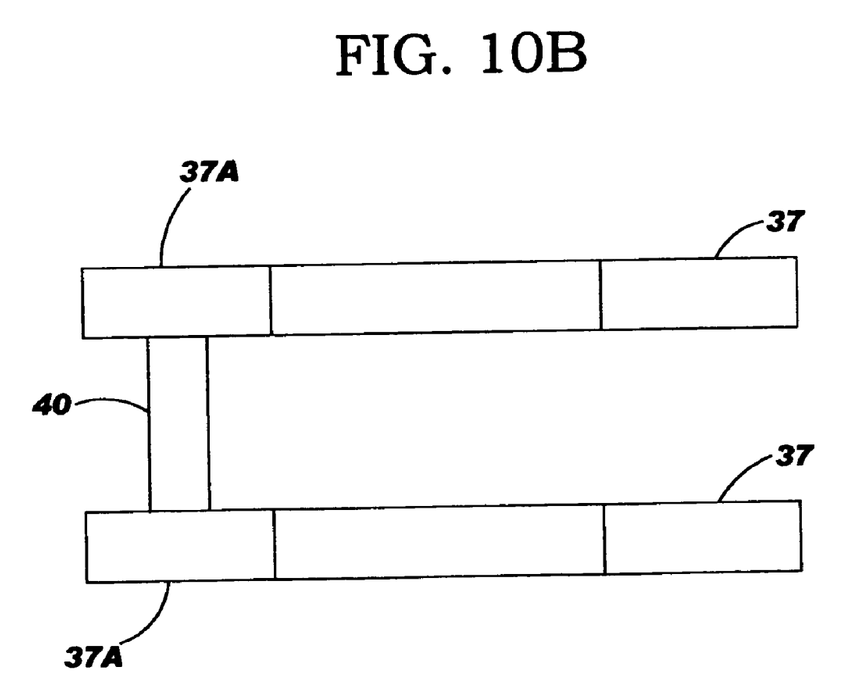

FIG. 10A shows a top view of typical configuration for conductive connector 41. As shown, signal pad 37 is conductively bridged to signal pad 37A by conductive wire or buss 38. It is clear that wire 38 may extend any distance. FIG. 10B shows a side view of FIG. 10A with conductive via 40 extending from upper signal pad 37A on the FC3 layer of FIG. 4 through the dielectric of this layer to lower signal pad 37A on the FC2 layer of FIG. 5. At that level, signal pad 37A is bridged back to the right, as shown in FIG. 5. However, it is clear that such an arrangement could bridge in any direction, any distance. Conductive via 40 may be, for example, a solid conductive member or plated vias, such as, a PTH type conductor.

The prior art top view of FIG. 5 shows a portion of the features of FC2 voltage V2 layer 1 shown in FIG. 1. Voltage busses 35 provide a voltage V2 at this level, but no signals escape from signal pads 37. Signal pads 37A extending from FC3 layer 3 above are bridged back the same distance to the right to signal pad 37 at essentially the same position as shown in FIG. 4.

Figure 6:
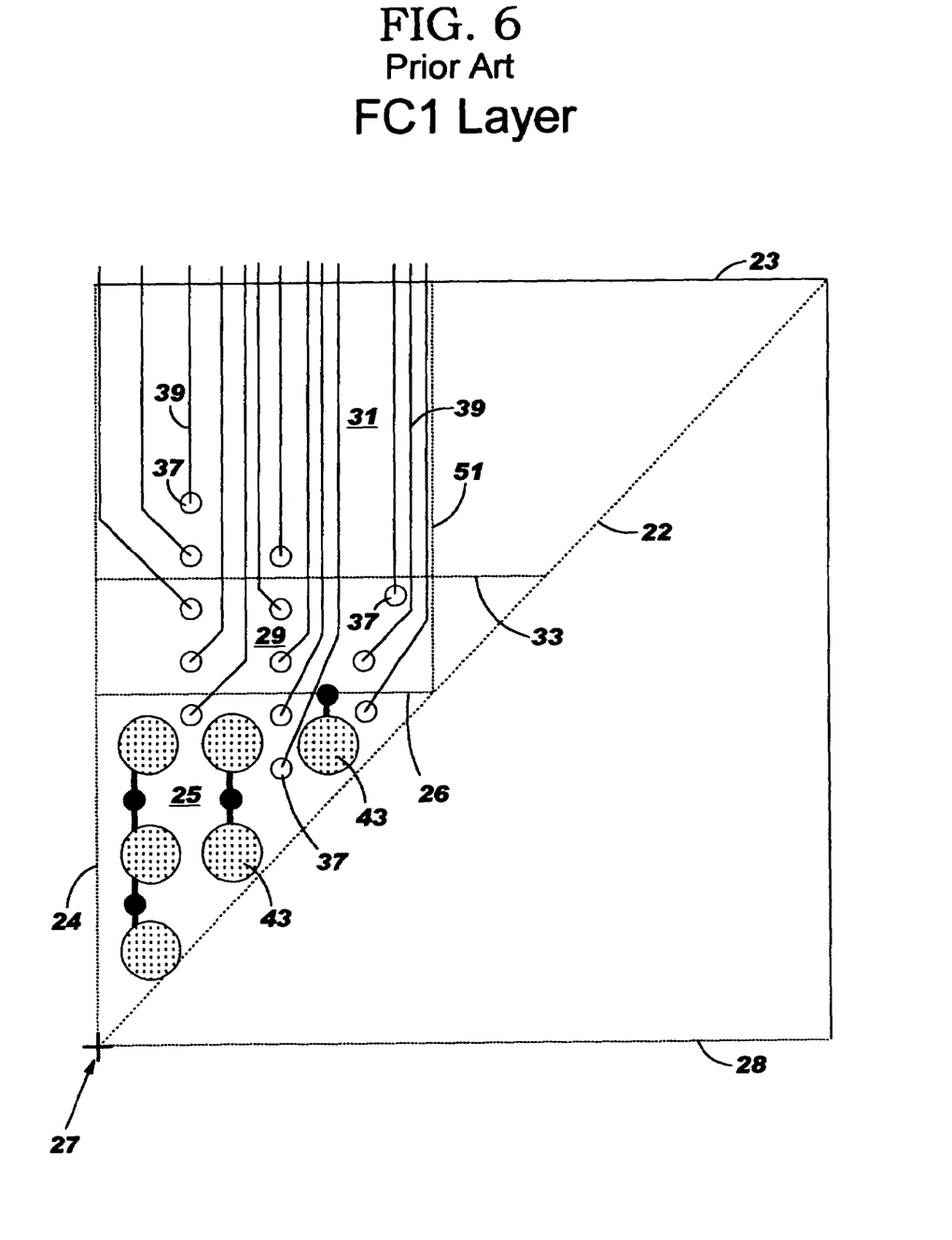
FIG. 6 shows a portion of the top view of a prior art FC1 signal redistribution layer, as represented in FIG. 1.

The prior art top view of FIG. 6 shows a portion of the features of the FC1 signal redistribution layer 21 in FIG. 1. As previously mentioned, signal pads 37 on the FC2 layer of FIG. 5 are connected to signal pads 37 on the FC1 layer of FIG. 6 by conductive vias. At this level, the remainder of the signal 37 pads escape off chip. As shown, the only region with enough open space to accommodate power distribution PTHs, underlying PTH pads 43, is region 25. This is due to the fact that the space in regions 29 and 31 are taken up with signal pads 37 and signal escape wires 39.

Figure 7:
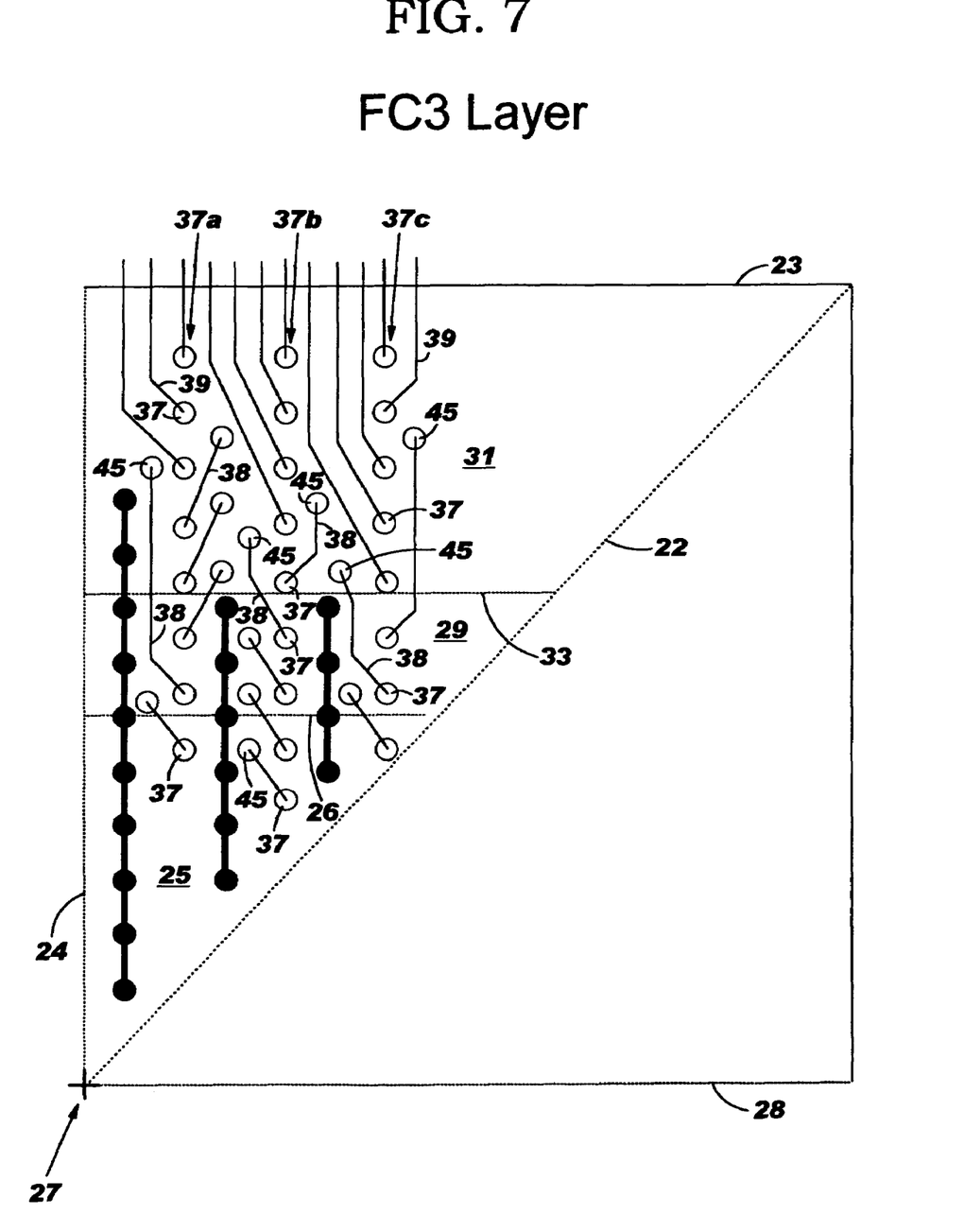
FIG. 7 shows a portion of the top view of an FC3 signal redistribution layer, according to the present invention.
Figure 8:
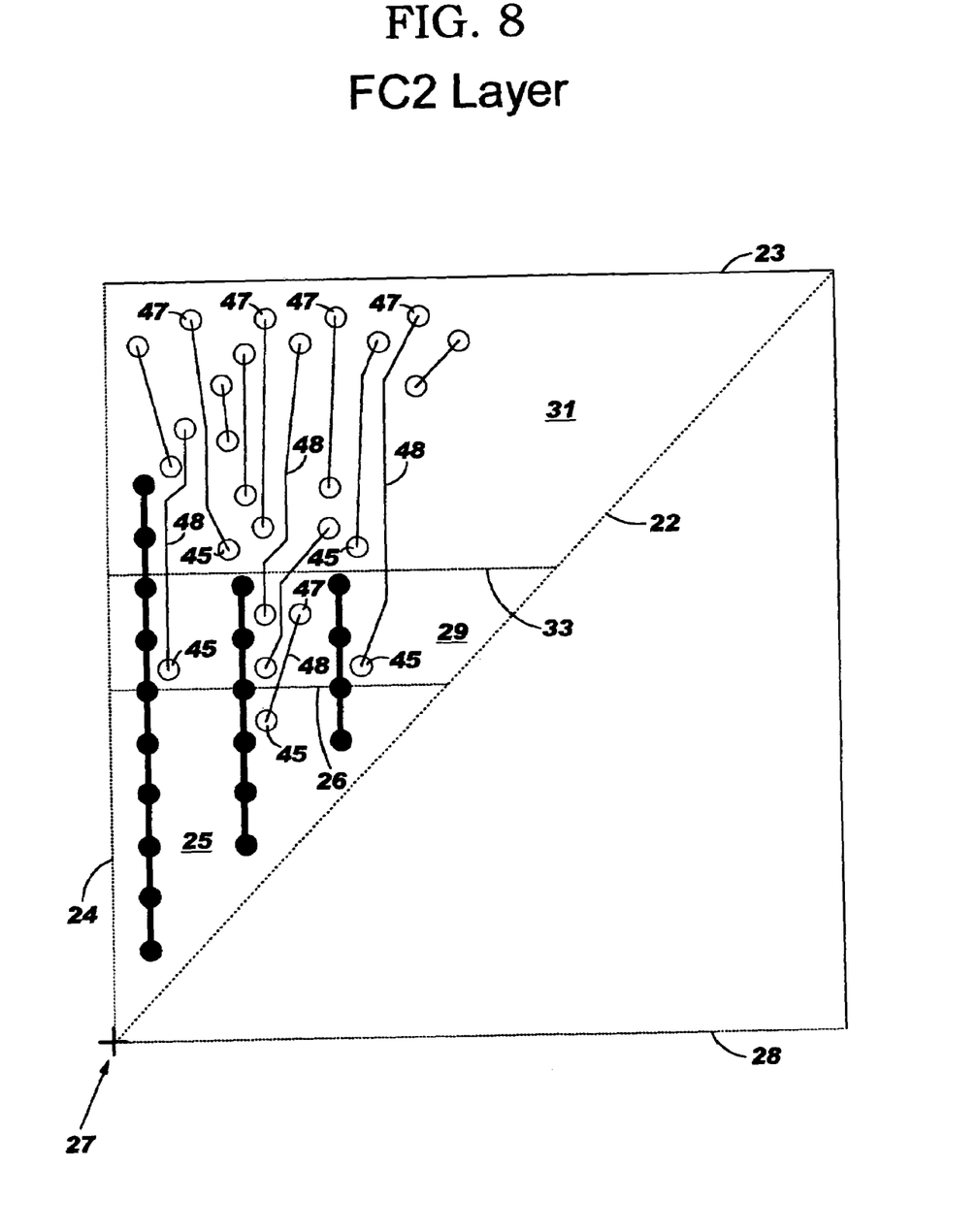
FIG. 8 shows a portion of the top view of an FC2 voltage layer, according to the present invention.
Figure 9:
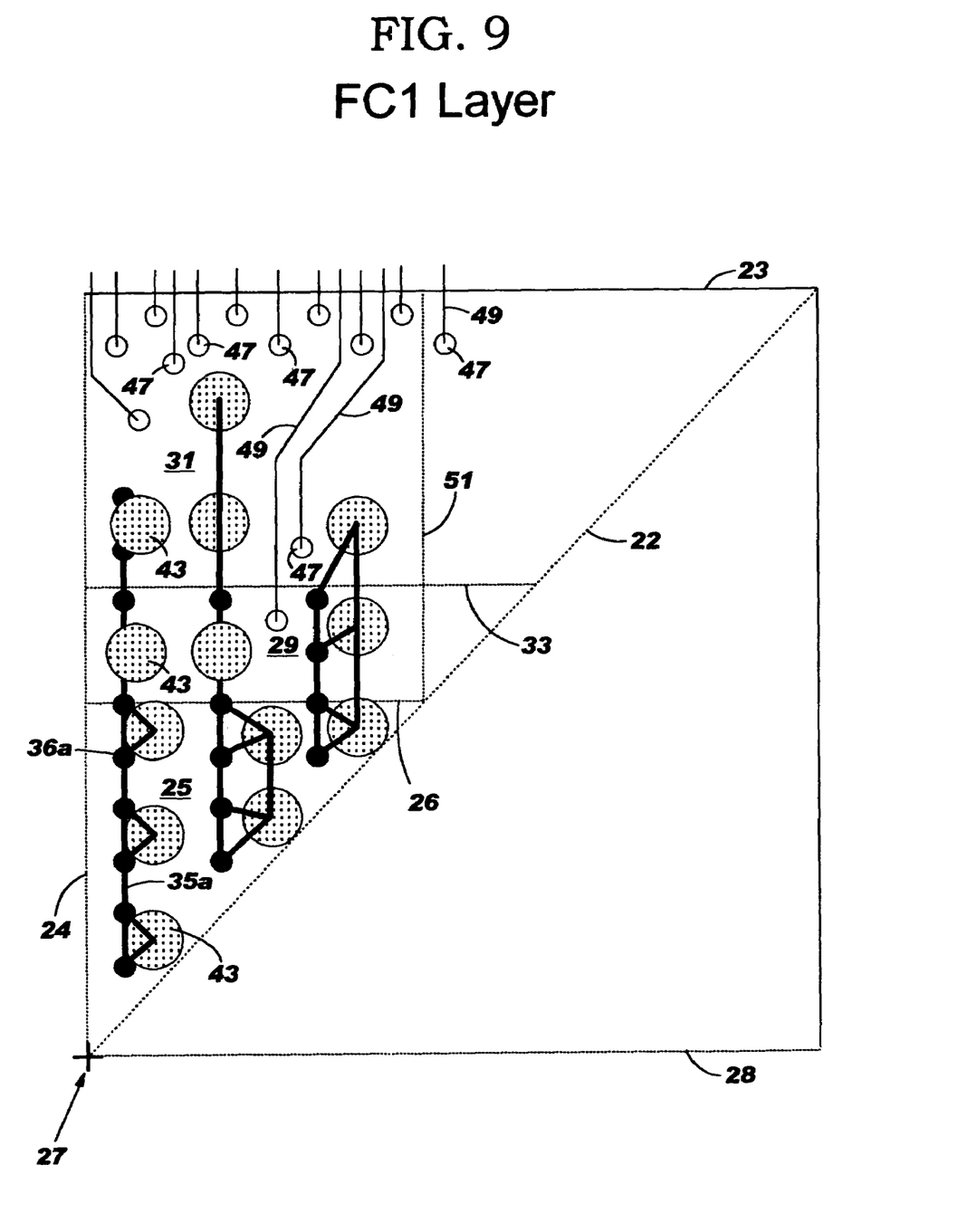
FIG. 9 shows a portion of the top view of an FC1 signal redistribution layer, according to the present invention.

In accordance with the present invention, a wiring escape arrangement employed at the FC3, FC2 and FC1 layer levels frees up space in all of regions 25, 29 and 31 to accommodate a significant increase in the number of PTHs for power distribution. In FIGS. 7, 8 and 9, the same ground/voltage buss and signal pad arrangements are employed as was employed in FIGS. 3 through 6. Similarly, like reference characters are used in FIGS. 7, 8 and 9 as were used for the same features in FIGS. 3 through 6.

The wiring escape arrangement, in accordance with the present invention, begins at the FC3 signal redistribution layer, a partial top view of which is shown in FIG. 7. Such layer corresponds to the FC3 signal redistribution layer 3, shown in FIG. 1. It should be noted that the FC4 ground layer 5 used here is the same as that shown in FIG. 3, as described above and, therefore, is not shown again. The first set of signal pads in FIG. 7 escape in the same pattern as that described in FIG. 4. Thus, three signal pads in column 37a, four signal pads in column 37b and five signal pads in column 37c escape on signal busses 39. However, in addition to these twelve signal pads escaping, the remaining thirteen signal pads 37 at this level are each electrically advanced to open areas toward chip edge 23 through signal wires or busses 38 to new pads 45.

When the signal pad arrangement of FIG. 7 is compared to that of FIG. 4, it can be seen that, as a result of this advancement of signal pads, one signal pad remains in region 25, rather than four signal pads, as in FIG. 4. In addition, four signal pads remain in region 29, rather than six, as in FIG. 4. The three signal pads remaining in region 31 are moved further toward chip edge bringing the total of eight signal pads within region 31. It is clear that similar advancement of signal pads could occur in the columns of signal pads (not shown) over the remainder of the chip. The particular pattern of advancement is not critical and various pattern arrangements could be implemented within the particular ground rules used for the technology employed. At the first order, it is obvious that there needs to be a clear path for the advancing signal wire and sufficient clearance from adjacent signal pads, wires and busses. Various processes could be employed to layout an effective pattern of advancing these signal pads.

FIG. 8 shows the top view of a portion of the FC2 voltage V2 layer, in accordance with the present invention. As can be seen, signal pads 45 in FIG. 8 are at the same position as signal pads 45 in FIG. 7 and are connected to one another by conductive vias, such as the via arrangement disclosed with regard to FIGS. 10A and 10B. As can be seen, the signal pads previously advanced in FIG. 7 to new signal pads 45, are again each electrically advanced in FIG. 8 toward chip edge 23 to new pads 47 through signal wires 48. As noted, the signal wires generally extend over considerable distances. It is possible that signal pads 45 could also escape at this level, rather than advance to signal pads 47 if signal paths were available across the voltage layer. At this same FC2 voltage layer in Prior Art FIG. 5, each of the signal pads extend laterally, within their own region, the same short distance.

When the signal pad arrangement of FIG. 8 is compared to that of the prior art signal pad arrangement of FIG. 5, it can be seen that in FIG. 8 no signal pads remain in region 25, as compared to four signal pads remaining in FIG. 5. Similarly, one signal pad remains in region 29 in FIG. 8 while six signal pads remain in FIG. 5.

FIG. 9 shows a portion of the top view of FC1 signal redistribution in accordance with the present invention, corresponding to layer 21 in FIG. 1. This is the second signal escape layer where all remaining signal pads 47 escape the chip. As is understood, the position of signal pads 47 on this FC1 layer are the same as the position of corresponding signal pads on the FC2 layer of FIG. 8 and are connected to one another by conductive vias. As can be seen, the area available for power PTHs is considerably expanded over what is available in the prior art FC1 signal redistribution layer arrangement of FIG. 6. In particular, the area available for power PTHs is expanded into all of region 29 and into a portion of region 31, as opposed to being limited to region 25, as seen in FIG. 6. This allows for the formation of thirteen power PTHs under pads 43 rather than six as shown in FIG. 6.

Line 51 is an extension from the corner of region 25 that delineates the areas of description. It is understood that a band of space along line 22, expanding slightly toward the end, also provides area for possible positioning of power PTHs. This is true for both the prior art and the layout arrangement of the present invention. This band of area also increases, according to the example used for the wiring arrangement of the present invention, to provide, a near twofold increase in the number of power PTHs.

It should be understood, that the layout pattern shown in FIGS. 7-9 is provided as an example of how the wiring concepts of the present invention may be implemented, and that different layout patterns, densities, via sizes, line widths, pad sizes, and the like, could provide more than a twofold improvement in space available for PTHs for power distribution. It should also be understood that the concepts of the pattern layout approach provided in the present invention may be used in any of a variety of multilayer chip carrier arrangements that employ two or more levels of escape.

It should be further understood that the effective result of moving the set of signal pads remaining after the first signal escape from the first set of pads, is to advance these remaining pads to a position beneath the area of the first set of pads. This advance is done in a two step process with the first step taking place at the same time, i.e., same layer level, that the first set of signal escape. The second advance takes place at a next layer level beneath the first escape level, and escape occurs at a layer beneath the second advance level.

It should be noted that although two levels of signal redistribution are described, more than two levels may be employed. If more than two levels of signal redistribution are used, then these additional levels may also be employed in similar manner to both advance signal pads toward chip edge and provide signal pad escape. For example, if three levels of signal redistribution are employed, then the advancement of remaining signal pads toward chip edge may occur at both the first signal escape and second signal escape level, and any intervening levels, with final escape occurring at the remaining levels, including the remaining signal redistribution level.

It will be understood from the foregoing description that various modifications and changes may be made in the preferred embodiment of the present invention without departing from its true spirit. It is intended that this description is for purposes of illustration only and should not be construed in a limiting sense. The scope of this invention should be limited only by the language of the following claims.

What is claimed is:

1. A method of fanout redistribution of signal pads on a multilayer chip carrier, comprising:

providing a layer of dielectric material having a plurality of signal pads formed thereon in a pattern of signal pads within the footprint of at least one chip to be carrier therein;

providing conductive lines connected to a first set of signal pads of said plurality of signal pads near the edge of said chip footprint extending beyond the edge of said chip footprint to allow signals from said first set of signal pads to escape said chip footprint;

moving a second set of signal pads of said plurality of signal pads closer to the edge of said chip footprint with at least some of said signal pads moved closer to the edge of said chip footprint having connections to signal pads on another layer of dielectric material; and moving at least some of said signal pads on said another layer of dielectric material closer to the edge of said chip footprint.

2. The method as set forth in claim 1 including the step of providing at least some of said signal pads on said another layer of dielectric material moved closer to the edge of said chip footprint with connections to signal pads on a further layer of dielectric material below said another layer of dielectric material.

3. The method as set forth in claim 2 including the step of providing conductive lines connected to at least some of the said signal pads on said further layer of dielectric material that extend beyond the edge of said chip footprint to allow signals from said signal pads on said further layer to escape said chip footprint.

4. The method as set forth in claim 3 wherein said plurality of signal pads are arranged adjacent a plurality of power distribution busses.

5. The method as set forth in claim 4 wherein PTHs are connected to said power distribution busses in the region of said moved signal pads.

6. The method as set forth in claim 5 wherein at least one chip is attached to said multilayer chip carrier.

7. The method as set forth in claim 6 wherein said multilayer chip carrier is attached to a printed wiring board.

* * * * *